United States Patent
Yu

(10) Patent No.: US 10,484,672 B2
(45) Date of Patent: Nov. 19, 2019

(54) NAKED EYE THREE-DIMENSIONAL (3D) DISPLAY DEVICE

(71) Applicant: WUHAN CHINA STAR OPTOELECTRONICS SEMICONDUCTOR DISPLAY TECHNOLOGY CO., LTD., Wuhan, Hubei (CN)

(72) Inventor: Wei Yu, Hubei (CN)

(73) Assignee: WUHAN CHINA STAR OPTOELECTRONICS SEMICONDUCOR DISPLAY TECHNOLOGY CO., LTD., Wuhan, Hubei (CN)

( * ) Notice: Subject to any disclaimer, the term of this patent is extended or adjusted under 35 U.S.C. 154(b) by 1 day.

(21) Appl. No.: 15/577,146

(22) PCT Filed: Nov. 16, 2017

(86) PCT No.: PCT/CN2017/111258
§ 371 (c)(1),
(2) Date: Nov. 27, 2017

(87) PCT Pub. No.: WO2019/056530
PCT Pub. Date: Mar. 28, 2019

(65) Prior Publication Data
US 2019/0098288 A1    Mar. 28, 2019

(30) Foreign Application Priority Data
Sep. 25, 2017  (CN) .......................... 2017 1 0872443

(51) Int. Cl.
*G02B 27/22* (2018.01)
*H04N 13/302* (2018.01)
(Continued)

(52) U.S. Cl.
CPC ....... *H04N 13/302* (2018.05); *G02B 27/2214* (2013.01); *G02F 1/1337* (2013.01);
(Continued)

(58) Field of Classification Search
CPC ............ H04N 13/302; G02F 1/134309; G02F 1/1337; G02F 1/133526; G02B 27/2214; H01L 51/5012
See application file for complete search history.

(56) References Cited

U.S. PATENT DOCUMENTS 3,654,606 A * 4/1972 Marlowe ............... G02F 1/1365
345/87
7,038,641 B2 * 5/2006 Hirota .................. G02B 6/0055
345/102

(Continued)

FOREIGN PATENT DOCUMENTS

CN    103149767 A    6/2013
CN    104020572 A    9/2014
(Continued)

OTHER PUBLICATIONS

Bonheur, "Igzo display: Advantages and disadvantages" (Year: 2017).*

(Continued)

*Primary Examiner* — Jayanti K Patel
*Assistant Examiner* — Shadan E Haghani

(57) ABSTRACT

A naked eye three-dimensional (3D) display device is provided and has a display panel and a liquid crystal lens located on a light-emitting side of the display panel. The display panel has a first glass substrate, organic light-emitting diode (OLED) device. The liquid crystal lens has a first thin film package layer, a first transparent electrode, a second glass substrate, a second transparent electrode and a liquid crystal layer located between the second transparent electrode and the first transparent electrode.

16 Claims, 2 Drawing Sheets

(51) Int. Cl.
  *H01L 51/50* (2006.01)
  *G02F 1/1337* (2006.01)
  *G02F 1/1343* (2006.01)
  *H04N 13/322* (2018.01)
  *G02F 1/1335* (2006.01)
(52) U.S. Cl.
  CPC .... *G02F 1/134309* (2013.01); *H01L 51/5012* (2013.01); *H04N 13/322* (2018.05); *G02F 1/133526* (2013.01)

(56) References Cited

U.S. PATENT DOCUMENTS

| | | | |
|---|---|---|---|
| 2012/0075434 A1 | 3/2012 | Kim et al. | |
| 2014/0125887 A1* | 5/2014 | Wu | G02B 27/22 349/12 |
| 2016/0197131 A1* | 7/2016 | Park | H01L 27/3267 349/139 |
| 2017/0084213 A1 | 3/2017 | Yang et al. | |
| 2017/0139218 A1 | 5/2017 | Lu et al. | |
| 2018/0114489 A1* | 4/2018 | Tan | G09G 3/3233 |

FOREIGN PATENT DOCUMENTS

| | | |
|---|---|---|
| CN | 104216127 A | 12/2014 |
| CN | 104834104 A | 8/2015 |
| CN | 105093553 A | 11/2015 |

OTHER PUBLICATIONS

Chang, "High-resistance liquid-crystal lens array for rotatable 2D/3D autostereoscopic display," (Year: 2014).*

Burrows, "Semitransparent cathodes for organic light emitting devices" (Year: 2000).*

"Passive Matrix Oled" (Year: 2019).*

* cited by examiner

NAKED EYE THREE-DIMENSIONAL (3D) DISPLAY DEVICE

FIELD OF INVENTION

The present invention relates to fields of displaying technologies, especially to a naked eye three-dimensional (3D) display device.

BACKGROUND OF INVENTION

With development of the displaying technologies, demands for three-dimensional (3D) display devices, especially for naked eye 3D displaying technologies, are increasing. The naked eye 3D displaying technologies allow users to enjoy 3D images without any external devices (for example, 3D glasses).

Conventional naked eye 3D technology primarily employs the principles of parallax of two eyes to allow a viewer to have 3D visual effects. By adjusting light, the conventional naked eye 3D technology limits left eye of the viewer to receive only left-eye images and right eye of the viewer to receive only right-eye images. A lens-type naked eye 3D displaying is one of the naked eye 3D technologies.

A conventional naked eye 3D display device, having complicated overall structures, needs 4 layers of glass substrates. Therefore, the naked eye 3D display device, having a great thickness, cannot satisfy increasing demand for increasing demands for light and thin display panels. Also, the conventional naked eye 3D display device has complicated manufacturing processes and high costs.

SUMMARY OF INVENTION

The present invention provides a naked eye three-dimensional (3D) display device that being able to decrease number of essential substrates in a naked eye 3D display device and thus further reduces a thickness of the naked eye 3D display device.

The present invention provides a naked eye 3D display device comprising a display panel and a liquid crystal lens located on a light-emitting side of the display panel.

The display panel comprises:

a first glass substrate; and an organic light-emitting diode (OLED) device disposed on a surface of the first glass substrate, the OLED device comprising a transparent cathode metal, and the transparent cathode metal disposed on a portion of the OLED device facing away from the first glass substrate;

The liquid crystal lens comprises:

a first thin film package layer covering a surface of the transparent cathode metal;

a first transparent electrode disposed on a surface of the first thin film package layer;

a second glass substrate disposed opposite to the first glass substrate;

a second transparent electrode disposed on a side of the second glass substrate facing the first glass substrate, and coupled to the first transparent electrode; and a liquid crystal layer disposed between the second transparent electrode and the first transparent electrode.

Multiple metal via holes defined in the first thin film package layer, and the first transparent electrode is electrically connected to the transparent cathode metal through the metal via holes.

According to an embodiment of the present invention, the second transparent electrode is a grid electrode or a stick electrode.

According to an embodiment of the present invention, the display panel further comprises a second thin film package layer disposed on a surface of the first transparent electrode.

According to an embodiment of the present invention, both the first thin film package layer and the second thin film package layer have a higher light transmission characteristic.

According to an embodiment of the present invention, both the first thin film package layer and the second thin film package layer are inorganic film layers, and the inorganic film layers are made of one or a combination of at least two of SiNx, SiON, and $Al_2O_3$.

According to an embodiment of the present invention, a first alignment film is disposed on a surface of the second thin film package layer. A second alignment film is disposed on a surface of the second transparent electrode. The second alignment film and the first alignment film are disposed opposite to each other. The liquid crystal layer is located between the first alignment film and the second alignment film.

According to an embodiment of the present invention, a sealant is coated on a periphery of the second glass substrate, and the first glass substrate and the second glass substrate are adhered together by the sealant.

According to an embodiment of the present invention, the OLED device further comprises a transparent anode metal, an electric-conductive layer and an organic light-emitting material layer.

According to an embodiment of the present invention, the OLED device employs either an active driving mode or a passive driving mode.

The present invention also provides a naked eye 3D display device comprising a display panel and a liquid crystal lens located on a light-emitting side of the display panel;

The display panel comprises:

a first glass substrate;

an organic light-emitting diode (OLED) device disposed on a surface of the first glass substrate, the OLED device comprising a transparent cathode metal, and the transparent cathode metal disposed on a portion of the OLED device facing away from the first glass substrate;

The liquid crystal lens comprises:

a first thin film package layer covering a surface of the transparent cathode metal;

a first transparent electrode disposed on a surface of the first thin film package layer;

a second glass substrate disposed opposite to the first glass substrate;

a second transparent electrode disposed on a side of the second glass substrate facing the first glass substrate, and coupled to the first transparent electrode; and a liquid crystal layer disposed between the second transparent electrode and the first transparent electrode.

According to an embodiment of the present invention, the second transparent electrode is a grid electrode or a stick electrode.

According to an embodiment of the present invention, the display panel further comprises a second thin film package layer disposed on a surface of the first transparent electrode.

According to an embodiment of the present invention, both the first thin film package layer and the second thin film package layer have a higher light transmission characteristic.

According to an embodiment of the present invention, both the first thin film package layer and the second thin film package layer are inorganic film layers, and the inorganic film layers are made of one or a combination of at least two of SiNx, SiON, and $Al_2O_3$.

According to an embodiment of the present invention, a first alignment film is disposed on a surface of the second thin film package layer. A second alignment film is disposed on a surface of the second transparent electrode. The second alignment film and the first alignment film are disposed opposite each other. The liquid crystal layer located between the first alignment film and the second alignment film.

According to an embodiment of the present invention, a sealant is coated on a periphery of the second glass substrate, and the first glass substrate and the second glass substrate adhered together by the sealant.

According to an embodiment of the present invention, the OLED device further comprises a transparent anode metal, an electric-conductive layer and an organic light-emitting material layer.

According to an embodiment of the present invention, the OLED device employs either an active driving mode or a passive driving mode.

The present invention reduces the number of the glass substrates from four to two by utilizing a configuration of the display panel with the liquid crystal lens, which lowers a thickness of the naked eye 3D display device and thus further decreases the manufacturing processes of the naked eye 3D display device.

DESCRIPTION OF DRAWINGS

To more clearly elaborate on the technical solutions of embodiments of the present invention or prior art, appended figures necessary for describing the embodiments of the present invention or prior art will be briefly introduced as follows. Apparently, the following appended figures are merely some embodiments of the present invention. A person of ordinary skill in the art may acquire other figures according to the appended figures without any creative effort.

DETAILED DESCRIPTION OF PREFERRED EMBODIMENTS

Figure 1:
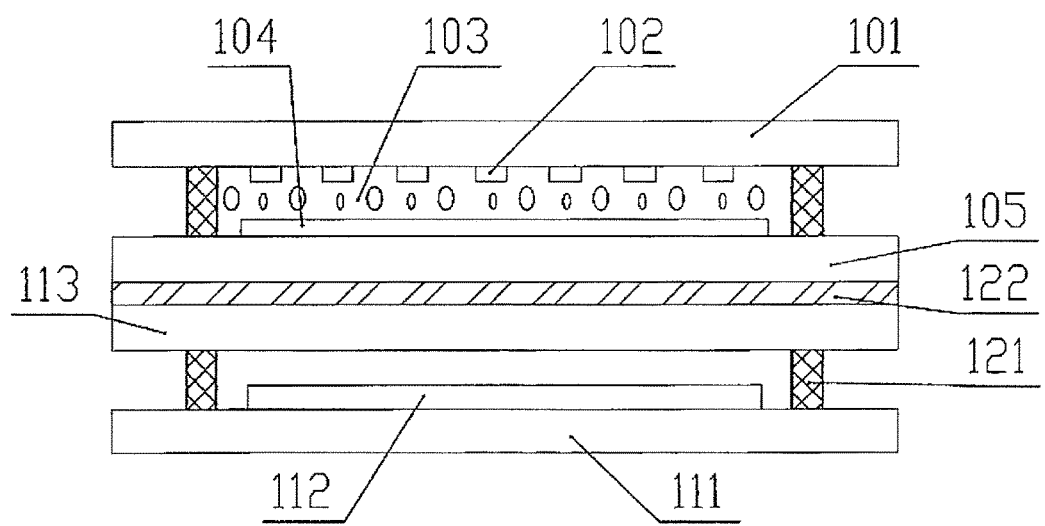
FIG. 1 is a schematic structural view of a conventional naked eye 3D display device in accordance with prior art.

Each of the following embodiments is described with appending figures to illustrate specific embodiments of the present invention that are applicable. The terminologies of direction mentioned in the present invention, such as "upper", "lower", "front", "rear", "left", "right", "inner", "outer", "side surface" and etc., only refer to the directions of the appended figures. Therefore, the terminologies of direction are used for explanation and comprehension of the present invention, instead of limiting the present invention. In the figures, units with similar structures are marked with the same reference numerals.

The present invention will be further explained with the combined appending figures and detailed embodiments as follows.

With reference to FIG. 1, in a conventional naked eye three-dimensional (3D) display device structure, an organic light-emitting diode (OLED) device 112 is separated from a first transparent electrode 104, a liquid crystal layer 103 and a second transparent electrode 102 by a first partitioning substrate 113 and a second partitioning substrate 105. The first partitioning substrate 113 and the second partitioning substrate 105 are adhered together by an optically clear adhesive (OCA) layer 122. The first glass substrate 111 and the first partitioning substrate 113 are adhered together by a sealant 121. The second glass substrate 101 and the second partitioning substrate 105 are adhered together by a sealant 121. A conventional naked eye 3D device comprises a first glass substrate 111, a second glass substrate 101, a first partitioning substrate 113 and a second partitioning substrate 105, which contains total four glass substrates to result in a greater thickness of the conventional naked eye 3D display device and is unable to fulfill increasing requirements for light and thin display panels.

Figure 2:
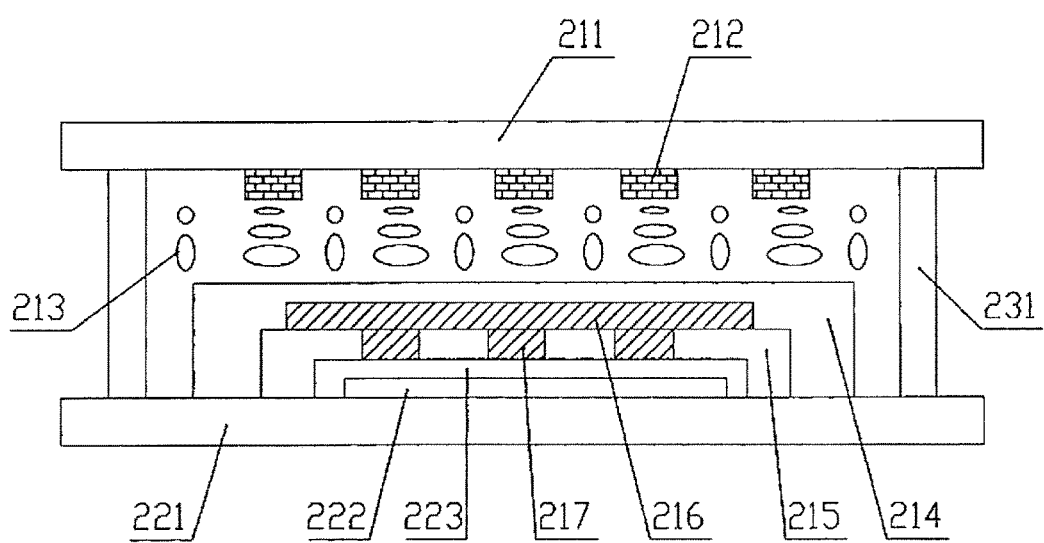
FIG. 2 is a schematic structural view of a naked eye three-dimensional (3D) display device in accordance with the present invention.

With reference to FIG. 2, the present invention provides a naked eye 3D display device. The naked eye 3D display device comprises a display panel and a liquid crystal lens located on a light-emitting side of the display panel.

The display panel comprises a first glass substrate 221 and an organic light-emitting diode (OLED) device 222.

The first glass substrate 221 employs alkali-free glass (alkali content <1%) with a thickness from 0.5 mm to 0.7 mm to prevent alkali ions, resulting in lowered resistivity of liquid crystal molecules, decreased displaying characteristics and reduced adhesive force between a sealant 231 and the first glass substrate 221, from being released into the liquid crystal layer 213.

The OLED device 222 is disposed on a surface of the first glass substrate 221. The OLED device 222 comprises a transparent cathode metal 223. The transparent cathode metal 223 is disposed on a portion of the OLED device 222 facing away from the first glass substrate 221. The OLED device 222 should have included a transparent cathode metal 223. Configuring the transparent cathode metal 223 independently out from the OLED device 222 in the present invention is for better explanation of advantageous effect that the present invention electrically connects the first transparent electrode 216 and the transparent cathode metal 223 to increase the conductivity rate of the transparent cathode metal 223 and to reduce manufacturing processes of the naked eye 3D display device.

In addition to the transparent cathode metal 223, the OLED device 222 also comprises a transparent anode metal, a hole transport layer and an organic light-emitting material layer.

The organic light-emitting material layer is located between transparent cathode metal 223 and transparent anode metal. Electrons flow from a cathode to an anode through the organic light-emitting material layer, and then are absorbed by the transparent anode metal. In a boundary between the organic light-emitting material layer and the hole transport layer, electrons are combined with holes, and the organic light-emitting material layer therefore emits light.

The OLED device 222 employs either an active driving mode, or a passive driving mode.

When the OLED device 222 employs the active driving mode, OLED device 222 has stick anodes (anode sticks), and stick cathodes (cathode sticks). Furthermore, the cathode sticks and the anode sticks are perpendicular to one another, an overlapping portion of each cathode stick and each anode stick represents a pixel point of the OLED device 222 的. For each of the pixel points, OLED device 222 requires an additional external circuit to output current to specific ones of the cathode sticks and the anode sticks to cause the pixel point to emit light. Intensity of the emitted light relates to the applied current. The OLED device 222 controls light emission by controlling the amount of current.

When the OLED device 222 employs the passive driving mode, the OLED device 222 has entire layers of an anode and a cathode, and a thin film transistor array is disposed between the cathode and a screen. The thin film transistor array decides whether each pixel of the OLED device 222 lights or not to control light emission of the OLED device 222.

The liquid crystal lens comprises: a first thin film package layer 215, a first transparent electrode 216, a second glass substrate 211, a second transparent electrode 212 and a liquid crystal layer 213.

The first thin film package layer 215 covers a surface of the transparent cathode metal 223. The first thin film package layer 215 is an inorganic film layer is made of one or a combination of at least two of SiNx, SiON, and $Al_2O_3$.

The first transparent electrode 216 is disposed on the first thin film package layer 215.

In the embodiment of the present invention, multiple metal via holes 217 are defined in first thin film package layer 215. The first transparent electrode 216 is electrically connected to the transparent cathode metal 223 through the metal via holes 217.

The liquid crystal lens also comprises a second thin film package layer 214 covering a surface of first transparent electrode 216. The second thin film package layer 214 and the first thin film package layer 215 are made of a same material, and are both configured for repelling water vapor and preventing the metal electrode from being eroded by liquid crystal molecules.

To ensure that OLED device emits left-eye light and right-eye light without interference, both the first thin film package layer 214 and the second thin film package layer 215 have higher light transmission effect.

The second glass substrate 211 and the first glass substrate 221 are disposed opposite to each other, and both the second glass substrate 211 and the first glass substrate 221 are made of a same material.

A sealant 231 is coated on a periphery of the second glass substrate 221, and the first glass substrate 221 and the second glass substrate 211 are adhered together by the sealant 231.

The second transparent electrode 212 is disposed on a side of the second glass substrate 211 facing the first glass substrate, and are coupled to the first transparent electrode 216.

The second transparent electrode is a grid electrode or a stick electrode.

The liquid crystal layer 213 is disposed between the second transparent electrode 212 and the first transparent electrode 216.

In the naked eye 3D display device, liquid crystal layer 213 serves as a deflection grating to realize a naked eye 3D effect. The first transparent electrode 216 is a lower electrode of the liquid crystal layer 213, and the second transparent electrode 212 is an upper electrode of the liquid crystal layer 213, the lower and upper electrodes cooperate to control deflection of liquid crystal molecules in the liquid crystal layer 213.

When a 2D displaying mode is implemented, a voltage value of the first transparent electrode 216 is adjusted to eliminate voltage difference between the first transparent electrode 216 and the second transparent electrode 212 such that the liquid crystal molecules in the liquid crystal layer 213 are not deflected. Light passes normally through the liquid crystal molecules, and screen light of the OLED device 222 under the liquid crystal lens, as originally emitted, would passes into human eyes, which performs a 2D effect.

When a 3D displaying mode is implemented, a voltage value of the first transparent electrode 216 is adjusted to generate voltage difference between the first transparent electrode 216 and second transparent electrode 212 such that the liquid crystal molecules in the liquid crystal layer 213 are deflected to form refraction rate gradient to form a light of a designated direction. By adjusting the left-eye light and the right-eye light of the OLED device 222, left and right eyes respectively receive the left-eye light and the right-eye light, which generates a 3D effect.

A first alignment film is disposed on the second thin film package layer 214. A second alignment film is disposed on the second transparent electrode 212. The first alignment film and the second alignment film are usually made of one or a combination of at least two of Polyimide (PI), $Al_2O_3$, and $Sl_3N_4$. The second alignment film corresponds to the first alignment film and cooperate to guide the arranging direction of the liquid crystal molecules of the liquid crystal layer 213. Each of the first alignment film and the second alignment film is a layer of a thin film with straight scratches, and a difference therebetween is that the straight scratches of the first alignment film are perpendicular to the straight scratches of the second alignment film.

The present invention reduces the number of the glass substrates from four to two by utilizing a configuration of the display panel with the liquid crystal lens, which lowers thickness of the naked eye 3D display device and thus further decreases the manufacturing processes of the naked eye 3D display device.

Although the preferred embodiments of the present invention have been disclosed as above, the aforementioned preferred embodiments are not used to limit the present invention. The person of ordinary skill in the art may make various of changes and modifications without departing from the spirit and scope of the present invention. Therefore, the scope of protection of the present invention is defined by the scope of the claims.

What is claimed is:

1. A naked eye three-dimensional (3D) display device, wherein the naked eye 3D display device comprises a display panel and a liquid crystal lens located on a light-emitting side of the display panel; wherein
  the display panel comprises:
    a first glass substrate; and
    an organic light-emitting diode (OLED) device disposed on a surface of the first glass substrate, the OLED device comprising a transparent cathode metal, and the transparent cathode metal disposed on a portion of the OLED device facing away from the first glass substrate;
  the liquid crystal lens comprises:
    a first thin film package layer covering a surface of the transparent cathode metal;
    a first transparent electrode disposed on a surface of the first thin film package layer;
    a second glass substrate disposed opposite to the first glass substrate;
    a second transparent electrode disposed on a side of the second glass substrate facing the first glass substrate, and coupled to the first transparent electrode; and a liquid crystal layer disposed between the second transparent electrode and the first transparent electrode;

multiple metal via holes are defined in the first thin film package layer; and the first transparent electrode is electrically connected to the transparent cathode metal through the metal via holes;

wherein a sealant is coated on a periphery of the second glass substrate, and the first glass substrate and the second glass substrate are adhered together by the sealant.

2. The naked eye 3D display device as claimed in claim 1, wherein the second transparent electrode is a grid electrode or a stick electrode.

3. The naked eye 3D display device as claimed in claim 1, wherein the display panel further comprises a second thin film package layer, and the second thin film package layer is disposed on a surface of the first transparent electrode.

4. The naked eye 3D display device as claimed in claim 3, wherein both the first thin film package layer and the second thin film package layer are transparent film layers.

5. The naked eye 3D display device as claimed in claim 3, wherein both the first thin film package layer and the second thin film package layer are inorganic film layers, and the inorganic film layers are made of one or a combination of at least two of SiNx, SiON, and $Al_2O_3$.

6. The naked eye 3D display device as claimed in claim 5, wherein a first alignment film is disposed on a surface of the second thin film package layer; a second alignment film is disposed on a surface of the second transparent electrode, the second alignment film and the first alignment film are disposed opposite to each other, and the liquid crystal layer is located between the first alignment film and the second alignment film.

7. The naked eye 3D display device as claimed in claim 1, wherein the OLED device further comprises a transparent anode metal, an electric-conductive layer and an organic light-emitting material layer.

8. The naked eye 3D display device as claimed in claim 7, wherein the OLED device employs an active driving mode, or employs a passive driving mode.

9. A naked eye three-dimensional (3D) display device, wherein the naked eye 3D display device comprises display panel and a liquid crystal lens located on a light-emitting side of the display panel; wherein the display panel comprises:
a first glass substrate;
an organic light-emitting diode (OLED) device disposed on a surface of the first glass substrate, the OLED device comprising a transparent cathode metal, and the transparent cathode metal disposed on a portion of the OLED device facing away from the first glass substrate;

the liquid crystal lens comprises:
a first thin film package layer covering a surface of the transparent cathode metal;
a first transparent electrode disposed on a surface of the first thin film package layer;
a second glass substrate disposed opposite to the first glass substrate;
a second transparent electrode disposed on a side of the second glass substrate facing the first glass substrate, and coupled to the first transparent electrode; and
a liquid crystal layer, disposed between the second transparent electrode and the first transparent electrode;
wherein a sealant is coated on a periphery of the second glass substrate, the first glass substrate and the second glass substrate are adhered together by the sealant.

10. The naked eye 3D display device as claimed in claim 9, wherein the second transparent electrode is a grid electrode or a stick electrode.

11. The naked eye 3D display device as claimed in claim 9, wherein the display panel further comprises second thin film package layer, and the second thin film package layer is disposed on a surface of the first transparent electrode.

12. The naked eye 3D display device as claimed in claim 11, wherein both the first thin film package layer and the second thin film package layer are transparent film layers.

13. The naked eye 3D display device as claimed in claim 11, wherein both the first thin film package layer and the second thin film package layer are inorganic film layers, and the inorganic film layers are made of one or a combination of at least two of SiNx, SiON, and $Al_2O_3$.

14. The naked eye 3D display device as claimed in claim 13, wherein a first alignment film is disposed on a surface of the second thin film package layer; a second alignment film is disposed on a surface of the second transparent electrode, the second alignment film and the first alignment film are disposed opposite to each other, the liquid crystal layer is located between the first alignment film and the second alignment film.

15. The naked eye 3D display device as claimed in claim 9, wherein the OLED device further comprises a transparent anode metal, an electric-conductive layer and an organic light-emitting material layer.

16. The naked eye 3D display device as claimed in claim 15, wherein the OLED device employs an active driving mode, or employs a passive driving mode.

* * * * *